United States Patent
Lou et al.

(10) Patent No.: US 10,276,607 B2
(45) Date of Patent: Apr. 30, 2019

(54) DISPLAY PANEL, MANUFACTURING METHOD THEREOF AND DISPLAY DEVICE

(71) Applicant: SHANGHAI TIANMA MICRO-ELECTRONICS CO., LTD., Shanghai (CN)

(72) Inventors: Junhui Lou, Shanghai (CN); Tianyi Wu, Shanghai (CN)

(73) Assignee: SHANGHAI TIANMA MICRO-ELECTRONICS CO., LTD., Shanghai, P.R. (CN)

(*) Notice: Subject to any disclaimer, the term of this patent is extended or adjusted under 35 U.S.C. 154(b) by 0 days.

(21) Appl. No.: 15/936,156

(22) Filed: Mar. 26, 2018

(65) Prior Publication Data

US 2018/0219032 A1    Aug. 2, 2018

(30) Foreign Application Priority Data

Jul. 31, 2017 (CN) .......................... 2017 1 0642361

(51) Int. Cl.
*H01L 27/12* (2006.01)
*H01L 27/32* (2006.01)

(52) U.S. Cl.
CPC ........ *H01L 27/1255* (2013.01); *H01L 27/127* (2013.01); *H01L 27/1225* (2013.01); *H01L 27/1229* (2013.01); *H01L 27/1251* (2013.01); *H01L 27/1288* (2013.01); *H01L 27/3265* (2013.01)

(58) Field of Classification Search
CPC ............ H01L 27/1255; H01L 27/1251; H01L 27/1229
See application file for complete search history.

(56) References Cited

U.S. PATENT DOCUMENTS

| | | | |
|---|---|---|---|
| 2015/0144910 A1* | 5/2015 | Beak | H01L 27/124 257/40 |
| 2015/0263079 A1* | 9/2015 | Ko | H01L 27/3265 257/40 |
| 2017/0294497 A1* | 10/2017 | Lius | H01L 27/1255 |
| 2018/0226436 A1* | 8/2018 | Lee | H01L 27/124 |

* cited by examiner

*Primary Examiner* — Walter H Swanson
(74) *Attorney, Agent, or Firm* — Alston & Bird LLP

(57) ABSTRACT

The disclosure discloses a display panel, a manufacturing method thereof and a display device. The display panel includes a backing substrate, a first active layer arranged over the backing substrate, and a second active layer arranged on a side of the first active layer away from the backing substrate. The first active layer and the second active layer each comprise a conductor region, and perpendicular projections of the conductor regions of the first and second active layers on the backing substrate have an overlapping region. A part of the conductor region of the first active layer corresponding to the overlapping region forms as a first electrode, a part of the conductor region of the second active layer corresponding to the overlapping region forms a second electrode, and the first electrode and the second electrode form two electrodes of a capacitor.

20 Claims, 13 Drawing Sheets

DISPLAY PANEL, MANUFACTURING METHOD THEREOF AND DISPLAY DEVICE

CROSS-REFERENCE TO RELATED APPLICATIONS

This application claims the priority to Chinese Patent Application No. CN201710642361.X, filed on Jul. 31, 2017, the content of which is hereby incorporated by reference in its entirety.

FIELD

The present disclosure relates to the technical field of display, in particular to a display panel, a manufacturing method thereof and a display device.

BACKGROUND

Owing to advantages such as being light and thin, low power consumption and high resolution, liquid crystal display panels have been widely used in such fields as flat televisions, mobile phones and computer displays. A liquid crystal display panel is usually composed of an array substrate, a color film substrate arranged opposite to the array substrate, and liquid crystals clamped between the two. The array substrate includes thin film transistors (TFT) arranged in arrays, where each TFT connects a pixel and is configured to control the brightness of the pixel, and each TFT also connects to a corresponding signal trace so as to realize circuit driving of the display panel.

As requirements of resolutions of display panels becomes higher and higher, arrangement of pixels becomes more compact, resulting in increase of the number of TFTs, signal traces, and the via holes connecting each signal trace in circuits controlling light emitting of pixels, leading to a greater size of a drive circuit of a display panel. However, if the size of the circuit is too large, an aperture ratio of a pixel is inevitably affected, and the display effect is affected.

SUMMARY

An embodiment of the present disclosure provides a display panel, a manufacturing method thereof and a display device, aiming at reducing the quantity of via holes configured to electrically connect electrodes or capacitors with other components, reducing a size of a circuit and simplifying a manufacturing process.

In a first aspect, the embodiment of the present disclosure provides a display panel. The display panel includes a backing substrate, a first active layer arranged over the backing substrate; and a second active layer. The first active layer belongs to a first transistor. The second active layer belongs to a second transistor. The second active layer is arranged on a side of the first active layer away from the backing substrate. The first active layer and the second active layer each include a conductor region, and a perpendicular projection of the conductor region of the first active layer on the backing substrate and a perpendicular projection of the conductor region of the second active layer on the backing substrate have an overlapping region. A part of the conductor region of the first active layer corresponding to the overlapping region forms as a first electrode, a part of the conductor region of the second active layer corresponding to the overlapping region forms a second electrode, and the first electrode and the second electrode form two electrodes of a capacitor.

In a second aspect, the embodiment of the present disclosure provides a display device which includes a display panel. The display panel includes a backing substrate, a first active layer arranged over the backing substrate; and a second active layer. The first active layer belongs to a first transistor. The second active layer belongs to a second transistor. The second active layer is arranged on a side of the first active layer away from the backing substrate. The first active layer and the second active layer each include a conductor region, and a perpendicular projection of the conductor region of the first active layer on the backing substrate and a perpendicular projection of the conductor region of the second active layer on the backing substrate have an overlapping region. A part of the conductor region of the first active layer corresponding to the overlapping region forms as a first electrode, a part of the conductor region of the second active layer corresponding to the overlapping region forms a second electrode, and the first electrode and the second electrode form two electrodes of a capacitor.

In a third aspect, the embodiment of the present disclosure provides a method for manufacturing the display panel, the method including the following operations: forming a first active layer over the backing substrate; forming a conductor region of the first active layer by treating a part of the first active layer to make the part of the first active layer conductive; forming a second active layer on a side of the first active layer away from the backing substrate; and forming a conductor region of the second active layer by treating a part of the second active layer corresponding to the conductor region of the first active layer to make the part of the second active layer conductive. The first active layer belongs to a first transistor. The second active layer belongs to a second transistor. A perpendicular projection of the conductor region of the first active layer on the backing substrate and a perpendicular projection of the conductor region of the second active layer on the backing substrate have an overlapping region. A part of the conductor region of the first active layer corresponding to the overlapping region forms as a first electrode. A part of the conductor region of the second active layer corresponding to the overlapping region forms a second electrode. The first electrode and the second electrode form two electrodes of a capacitor.

DETAILED DESCRIPTION OF AN EMBODIMENT

Figure 1:
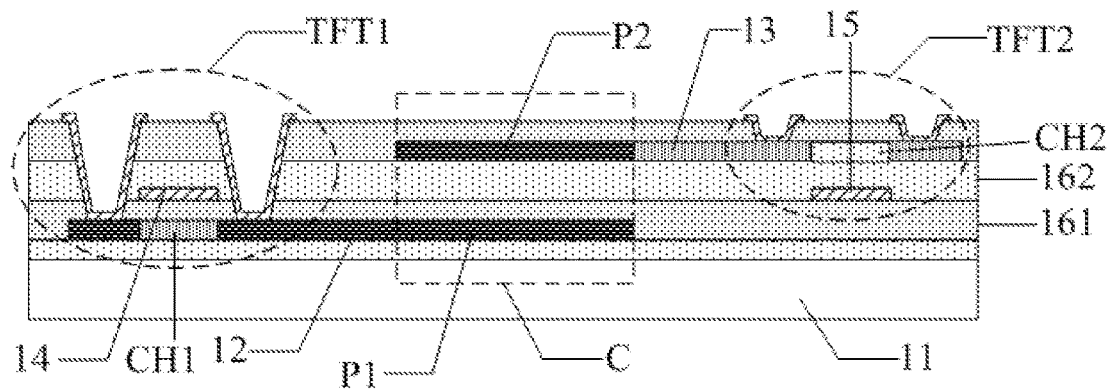
FIG. 1 is a first schematic cross sectional diagram of a display panel according to an embodiment of the present disclosure.

The embodiment of the present disclosure provides a display panel, a manufacturing method thereof and a display device, aiming at reducing the number of via holes configured to electrically connect electrodes or capacitors with other components, reducing a size of a circuit, and simplifying a manufacturing process.

In order to make the above objectives, features and advantages of the present disclosure become more apparent, the present disclosure is described further in detail in combination with the accompanying drawings and the embodiment. However, exemplary implementations can be implemented in various forms, and should not be considered as being limited to the embodiment described herein. On the contrary, these implementations enable the present disclosure to be more comprehensive and complete, and concepts of the embodiment are conveyed to those skilled in the art in a comprehensive manner. In the drawings, a same reference numeral represents a same or similar structure. Therefore, repeated descriptions are omitted herein. Words expressing positions and directions described in the present disclosure are both explanations with the accompanying drawings as an example, which can be changed according to specific needs, and these changes are all included in the protection scope of the present disclosure. The accompanying drawings of the present disclosure are only configured to denote relative positional relationships, and layer thickness of some parts adopts an exaggerated drawing manner for convenient understanding, and the layer thickness in the drawings does not represent a proportional relationship of actual layer thickness.

It should be noted that specific details are described below for sufficient understanding of the present disclosure. However, the present disclosure can be implemented in multiple other modes different from those described herein, and those skilled in the art can make similar generalizations without prejudice to the connotation of the present disclosure, therefore, the present disclosure is not limited by the specific embodiment disclosed below. For example, the expression that "one part is arranged at one side of another part" mentioned in the specification and the claims includes conditions that the one part is adjacent to or not adjacent to the other part, and the expression that "one part is arranged at the side away from another part" mentioned in the specification and the claims includes conditions that the one part is adjacent to or not adjacent to the other part. The follow-up description of the specification is optional embodiment for implementing the present disclosure. However, the description aims at describing the general purpose of the present application, rather than limiting the scope of the present application. The protection scope of the present application shall be determined by the appended claims.

A brief description is given below of the display panel, the manufacturing method and the display device according to the embodiment of the present disclosure in combination with the accompanying drawings below, wherein the thickness and shape of each part in the drawings do not reflect the actual proportion of the display device, only with the aim of schematically illustrating the content of the present disclosure.

FIG. 1 is a structural schematic diagram of a display panel according to the embodiment of the present disclosure. As shown in FIG. 1, the display panel according to the embodiment of the present disclosure includes a backing substrate 11, a first active layer 12 arranged over the backing substrate 11, and a second active layer 13. The first active layer 12 belongs to a first transistor TFT1. The second active layer 13 belongs to a second transistor TFT2. The second active layer 13 is arranged on a side of the first active layer 12 away from the backing substrate 11.

The first active layer 12 and the second active layer 13 each include a conductor region, and a perpendicular projection of the conductor region of the first active layer 12 on the backing substrate 11 and a perpendicular projection of the conductor region of the second active layer 13 on the backing substrate 11 have an overlapping region (i.e. the region enclosed by a dotted rectangle as shown in FIG. 1). It can be understood by those skilled in the art that the perpendicular projection on the backing substrate herein refers to a projection where all the projection lines are orthogonal to the backing substrate.

A part P1 of the conductor region of the first active layer corresponding to the overlapping region forms as a first electrode. A part P2 of the conductor region of the second active layer corresponding to the overlapping region forms a second electrode. The first electrode and the second electrode form two electrodes of a capacitor C.

The display panel according to the embodiment of the present disclosure can be a liquid crystal display panel, or can be a display panel in another form of light emitting such an organic light emitting diode (OLED) display panel. When the above-mentioned display panel is a liquid crystal display panel, the display panel usually includes an array substrate and a color film substrate arranged opposite one another, and a liquid crystal layer is clamped between the two. The backing substrate, at one side of the array substrate can usually be a glass substrate. A TFT array and related circuits can be formed over the glass substrate, so as to control deflection of liquid crystal layers corresponding to each pixel to achieve the aim of controlling brightness of each pixel. When the above-mentioned display panel is an organic light emitting diode display panel, the backing substrate can be a glass substrate. And when the backing substrate is made of such flexible materials as polyimide (PI) and polycarbonate (PC), it can also be a flexible display panel. A TFT circuit layer is manufactured over the backing substrate, so as to control light emitting of each pixel.

Figure 2:
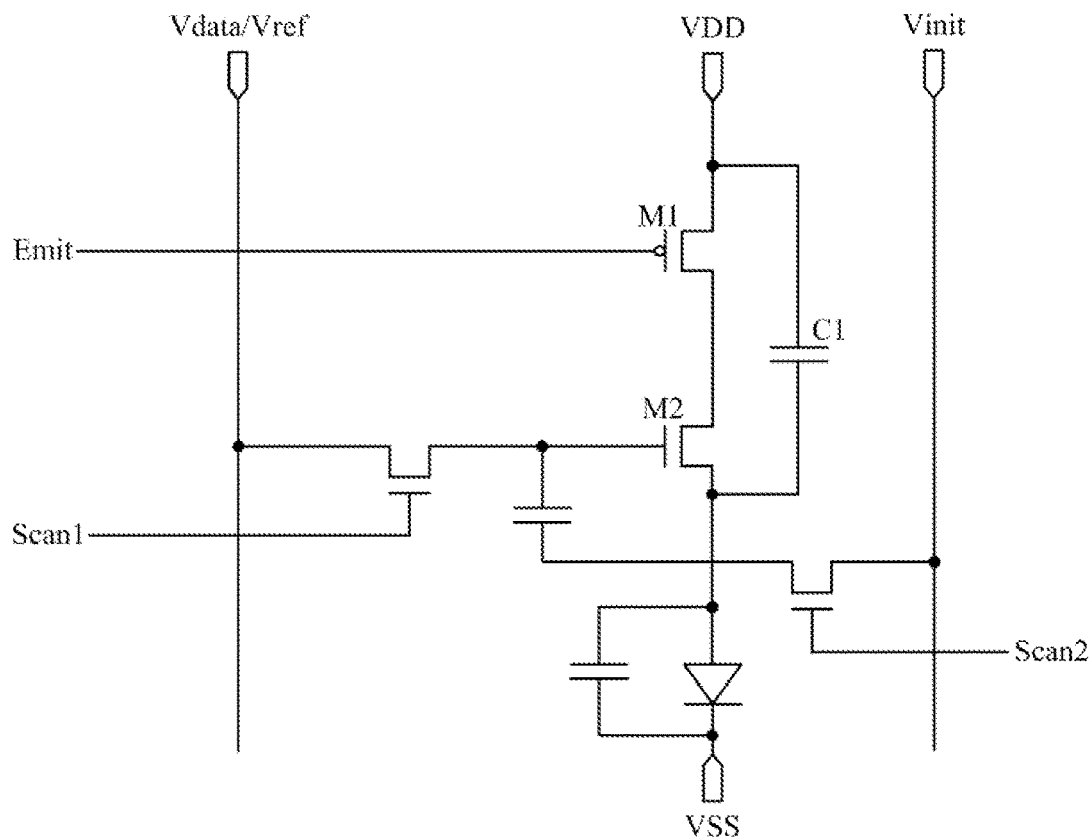
FIG. 2 is a circuit diagram of the display panel according to the embodiment of the present disclosure.

In specific application, the above-mentioned capacitor structure according to the embodiment of the present disclosure can be used in a circuit as shown in FIG. 2. FIG. 2 shows a part of a structure of a pixel circuit, where a capacitor C1 needs to be connected between a source of a transistor M1 and a drain of a transistor M2. When an active layer of the transistor M1 and an active layer of the transistor M2 are located in different layers, the capacitor C1 can be formed with the above-mentioned method according to the embodiment of the present disclosure. Specifically, the active layer of the transistor M1 and the active layer of the transistor M2 both have a conductor region, and perpendicular projections of the conductor regions of the two have an overlapping region on the backing substrate, then the parts of the conductor regions of the two active layers corresponding to the overlapping region can be served as two electrodes of the capacitor C1. Since the conductor region of each active layer can be directly connected with the source/drain region which connects the transistor M1 and the transistor M2 in a lapping manner, namely, the two electrodes of the capacitor C1 can be directly connected to the source of the transistor M1 and the drain of the transistor M2, no additional via holes and lead wires are required to connect the electrodes of the capacitor and the source/drain of the transistors, saving circuit space occupied by additional via holes and lead wires, thereby not only reducing the size of the circuit, but also simplifying the manufacturing process.

Particularly, in an organic light emitting diode display screen, in order to maintain the working point of a light emitting device in a saturation region, a complex compensating circuit is usually required. In response to the demand of some compensating circuits, a capacitor should be added between two thin film transistors. According to the present embodiment, because the part of the conductor region of the first active layer corresponding to the overlapping region and the part of the conductor region of the second active layer corresponding to the overlapping region respectively serve as the two electrodes of a capacitor, the manufacturing operations of the capacitor structure connected between the source/drain of the first transistor and the source/drain of the second transistor can be simplified, where the capacitor structure no longer needs via holes and connecting lines to connect corresponding source and drain, thereby reducing the space configured for manufacturing the via holes and connecting lines, and reducing the size of the whole circuit. The design of the circuit can be simplified, the size of the capacitor in the circuit can be reduced, and the overall space occupied by the compensating circuit can be reduced. No new film layer needs to be added, and no new electrode pattern needs to be added, therefore, when the image quality is guaranteed, the manufacturing process is simplified, and more circuit space is saved.

It should be noted that, the embodiment of the present disclosure only takes the circuit structure shown in FIG. 2 as an example, but is not limited to the circuit shown in FIG. 2. In specific implementations, as long as the capacitor is connected between the source and drain of two transistors, and the active layers of the two transistors are located in different layers, the concept of the present disclosure can be adopted to form a capacitor structure, thereby reducing the size of the circuit.

Furthermore, in the above-mentioned display panel according to the embodiment of the present disclosure, the first active layer 12 and the second active layer 13 are made of different materials. Specifically, the first active layer 12 can be made of low-temperature polycrystalline silicon (LTPS, also called Low Temperature Poly-Silicon), and the second active layer 13 can be made of an oxide semiconductor. The LTPS is suitable for manufacturing a driving module of the panel with a high resolution, such as an element in the driving circuit and can also directly integrate a drive circuit onto a glass substrate, so that the panel has advantages such as low power consumption, high aperture ratio, high resolution and high brightness. Although oxide semiconductors represented by indium gallium zinc oxide (IGZO) has a lower mobility rate than the LTPS, oxide semiconductor materials are mostly transparent with good uniformity, and may be used to manufacture a flexible substrate. In an actual application, giving consideration to both the stability of the LTPS and the uniformity of the oxide semiconductor, the two different materials can be used at suitable positions to form a TFT. In addition, the first active layer 12 and the second active layer 13 can be manufactured by adopting other materials, or the first active layer 12 and the second active layer 13 can be manufactured by adopting a same kind of materials. For example, the first active layer 12 and the second active layer 13 can both be manufactured by adopting an oxide semiconductor, and the selection of materials of the active layers is not specifically limited in the embodiment of the present disclosure.

In a specific implementation, in the above-mentioned display panel according to the embodiment of the present disclosure, the part of the first active layer, P1, corresponding to the overlapping region and the part of the second active layer, P2, corresponding to the overlapping region (namely, the dotted rectangle as shown in FIG. 1) are both active layers which have been subjected to conductive processing, or have been treated to be conductive. The active layers in the overlapping region have an enhanced electrical conductivity after being subjected to conductive processing and can be configured as a conductor. In the embodiment of the present disclosure, the parts of the first and second active layers corresponding to the above overlapping region can be configured as two electrodes of a capacitor. The manners of conductive processing are different when different materials are adopted. Specific manners of conductive processing are described below with the first active layer 12 made of a low-temperature polycrystalline silicon semiconductor and the second active layer 13 made of an oxide semiconductor as an example.

It should be noted that, since the manufacturing temperature of the LTPS is relatively high, in order not to influence the manufacturing of the oxide semiconductor, the LTPS is formed in a bottom layer, while the oxide semiconductor is formed above the LTPS. Specifically, when the material of the first active layer 12, which is located in a lower layer, is a low-temperature polycrystalline silicon semiconductor, the part of the first active layer corresponding to the overlapping region is a heavily-doped low-temperature polycrystalline silicon layer. In an actual application, a manner of ion implantation can be adopted to conduct ion doping on the part of the first active layer 12 corresponding to the overlapping region, and the implanted ion is boron ion or phosphorus ion. Greater the strength of ion implantation is, better the ion implantation effect is. A barrier figure can be formed over the first active layer 12 before ion implantation, and then the active layer of a specified region can be subjected to conductive processing. Furthermore, when the material of the second active layer 13 is an oxide semiconductor, the part of the second active layer corresponding to the overlapping region is an oxide semiconductor layer which has been subjected to plasma processing. In an actual application, gas used for plasma processing can be one of helium, argon, hydrogen or nitrogen. The technology of plasma processing is mature. Before the second active layer 13 is subjected to plasma processing, a barrier film layer also needs to be formed at a position which does not need conductive processing, for fear of damaging the property of the part of the second active layer 13 which does not need conductive processing. In the embodiment of the disclosure, the parts of the first active layer and the second active layer corresponding to the overlapping region are subjected to conductive processing, respectively, with respect to different materials, such that the parts corresponding to the overlapping region are converted into conductors to serve as two electrodes of a capacitor structure.

In a specific implementation, in the above-mentioned display panel according to the embodiment of the present disclosure, the active layers are also configured to form transistors, and a part of each active layer configured for a channel region of a transistor should reserve its semiconductor property. Specifically as shown in FIG. 1, the first transistor TFT 1 includes a first gate 14 and the second transistor TFT 2 includes a second gate 15. A perpendicular projection of the first gate 14 on the first active layer 12 is located in a first channel region CH1. A perpendicular projection of the second gate 15 on the second active layer is located in a second channel region CH2. The first channel region CH1 does not overlap the conductor region of the first active layer. The second channel region CH2 does not overlap the conductor region of the second active layer. The first channel region CH1 and the second channel region CH2 ensure normal working properties of the first transistor TFT1 and the second transistor TFT2, while the conductor regions can be configured as electrodes of a capacitor or connecting regions for connecting other electrodes in a lapping manner and for realizing other corresponding functions.

In an actual application, a transistor made of low-temperature polycrystalline silicon is usually of a top gate structure, while a transistor made of an oxide semiconductor can be of a top gate or a bottom gate structure. Specific description is given below with respect to different structures.

Figure 3:
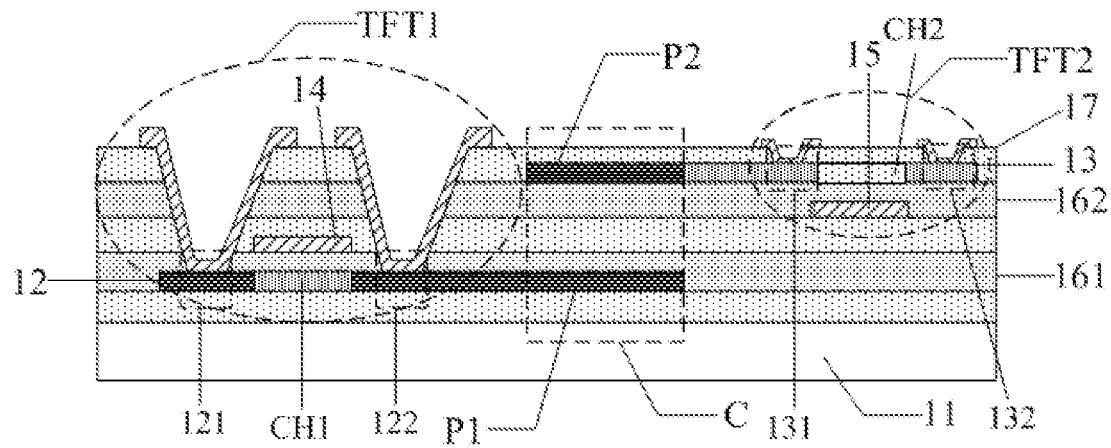
FIG. 3 is a second schematic cross sectional diagram of a display panel according to the embodiment of the present disclosure.

In an implementation, as shown in FIG. 3 which is a structural schematic diagram of another display panel according to the embodiment of the present disclosure, the first gate 14 and the second gate 15 are both arranged between the first active layer 12 and the second active layer 13; the display panel further includes a first insulation layer 161 between the first active layer 12 and the first gate 14 and a second insulation layer 162 between the second active layer 13 and the second gate 15. The first insulation layer 161 is a gate insulation layer of the first gate 12; and the second insulation layer 162 is a gate insulation layer of the second gate 15. When the display panel according to the embodiment of the present disclosure adopts the structure as shown in FIG. 3, the first transistor TFT1 is of a top gate structure, and the second transistor TFT2 is of a bottom gate structure. When the second transistor TFT2 adopts a bottom gate structure, the second gate 15 and the second insulation layer over the second gate 15 can be configured as an optical protective layer of the second channel region, thereby preventing external environmental light or backlight from irradiating onto the second channel region to generate carriers which may damage the electrical property of the second channel region. Furthermore, as shown in FIG. 3, an interlayer insulation layer (not shown in the figure) is also arranged between the first gate 14 of the first transistor TFT1 and the second gate 15 of the second transistor TFT2, the transistors can be arranged more closely by adopting such a structure. Even though the perpendicular projections of the first gate 14 and the second gate 15 on the backing substrate have a certain overlapping region, since the insulation layer exists between the two gates, crosstalk of signals is prevented.

As another implementation as shown in FIG. 1, the first gate 14 and the second gate 15 can also be arranged in a same layer. It should be ensured that the perpendicular projections of the first gate 14 and of the second gate 15 on the backing substrate 11 do not overlap. When the first gate 14 and the second gate 15 are arranged on the same layer, the first gate 14 and the second gate 15 can be formed simultaneously by adopting a same material in a one composition process, thereby reducing another composition operation of forming the second gate 15 and simplifying the manufacturing process, where the composition process refers to a patterning process such as an itching process.

Furthermore, as shown in FIG. 3, the above display panel according to the embodiment of the present disclosure further includes an etching barrier layer 17 which is located on a side, away from the backing substrate 11, of the second active layer 13. The etching barrier layer 17 can protect the second active layer 13 from being damaged when an etching process of another film layer is conducted. The etching barrier layer 17 needs to be arranged when the second transistor TFT2 is of a bottom gate structure.

Furthermore, as shown in FIG. 3, the first active layer 12 further includes a first source contact region 121 and a first drain contact region 122 separated by the first channel region CH1; and the second active layer 13 further includes a second source contact region 131 and a second drain contact region 132 separated by the second channel region CH2. In an actual application, the above-mentioned first source contact region 121, the first drain contact region 122, the second source contact region 131 and the second drain contact region 132 are all regions which have been subjected to conductive processing, and these regions are respectively connected with the source and drain of the first transistor and the source and drain of the second transistor in a lapping manner to form complete transistor structures.

In the above-mentioned display panel according to the embodiment of the present disclosure, active layers configured to form different kinds of transistors, namely, the above first active layer and the second active layer, are formed by adopting two different materials and manufacturing processes. After the parts of the first active layer and the second active layer corresponding to the overlapping region are subjected to conductive processing, they can be configured as two electrodes of a capacitor structure connected between the source and drain of two transistors. Compared with the condition where only one active layer is formed, the two electrodes of the capacitor structure according to the embodiment of the present disclosure do not need additional lead wires to connect to the source/drain of a transistor, therefore, the connecting via holes and lead wires do not need to be additionally arranged for the capacitor. Since the two electrodes of the capacitor both do not need lead wires, metal traces (such as various signal lines) can all overlap the capacitor region, thereby saving the wiring space and reducing the size of the circuit.

Figure 4:
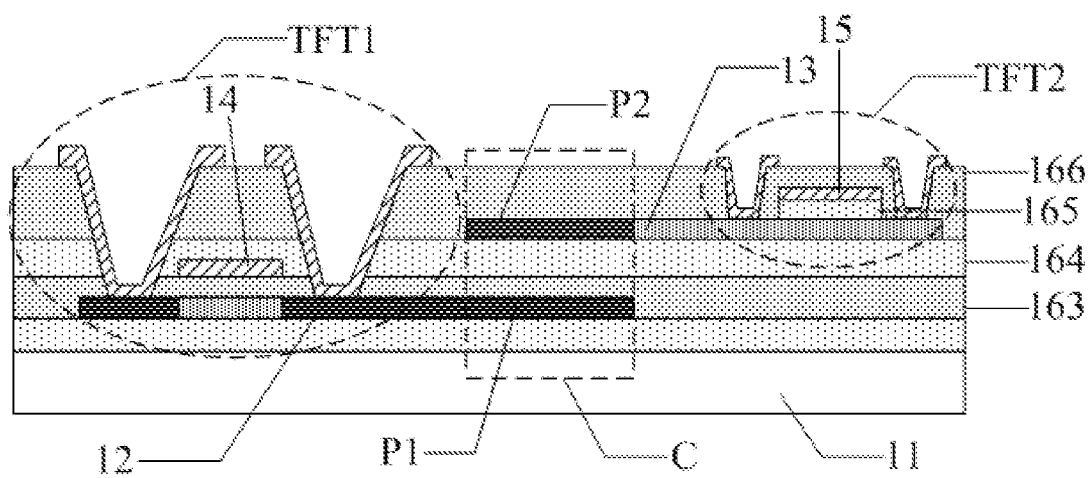
FIG. 4 is a third cross sectional diagram of a display panel according to the embodiment of the present disclosure.

In another implementation, as shown in FIG. 4, which is a structural schematic diagram of another display panel according to the embodiment of the present disclosure, the first gate 14 is arranged between the first active layer 12 and the second active layer 13, while the second gate 15 is arranged on a side, away from the backing substrate 11, of the second active layer 13. The display panel further includes a third insulation layer 163 between the first active layer 12 and the first gate 14, a fourth insulation layer 164 between the second active layer 13 and the first gate 14, a fifth insulation layer 165 between the second gate 15 and the second insulation layer 13, and a sixth insulation layer 166 on a side, away from the second active layer 13, of the second gate 15. The third insulation layer 163 is a gate insulation layer of the first gate 14 and the fifth insulation layer 165 is a gate insulation layer of the second gate 15.

When the display panel according to the embodiment of the present disclosure adopts the structure as shown in FIG. 4, both the first transistor TFT1 and the second transistor TFT2 are of a top gate structure. When the second transistor TFT2 adopts the top gate structure, no etching barrier layer needs to be manufactured, and the second gate 15 and the insulation layer (namely the fifth insulation layer 165) of the second gate 15 can play a role of protecting the second channel region.

In conclusion, no matter whether the second transistor TFT2 is manufactured to be of a bottom gate structure or of a top gate structure, after the parts of the active layers corresponding to the overlapping region are subjected to conductive processing, the structure adopting two active layers can use these parts as two electrodes of the capacitor structure connecting the source and drain of two transistors corresponding to two active layers, thereby saving the space of the lead wires and via holes necessary for connecting the capacitor, and other traces can also be arranged in the overlapping region of the capacitor structure, thereby reducing the size of the whole circuit and simplifying the manufacturing process.

Figure 5:
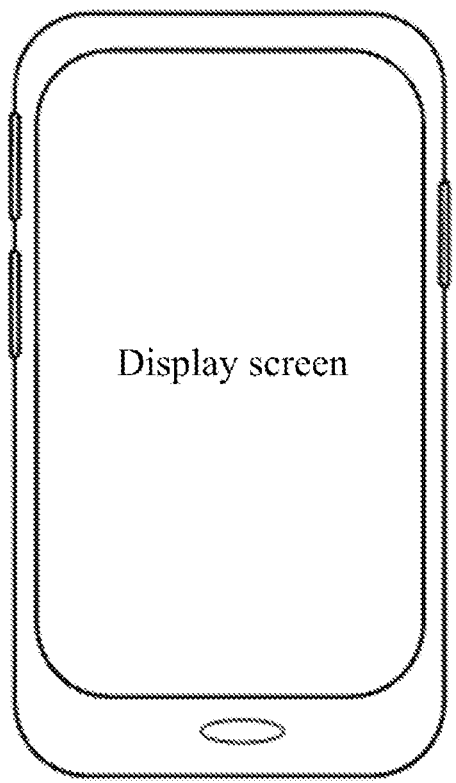
FIG. 5 is a top view of a display device according to the embodiment of the present disclosure.

Based on the same inventive concept, the embodiment of the present disclosure further provides a display device, and the display device includes any one of the above-mentioned display panels. The display device can be a liquid crystal panel, a liquid crystal display, a liquid crystal display television, an OLED panel, an OLED display, an OLED television or electronic paper. It and can also be mobile devices such as mobile phones and smart phones. FIG. 5 is a top view of the above-mentioned display device according to the embodiment of the present disclosure when the display device is a smart phone, where the display screen can adopt the structure of any of the above-mentioned display panels and it is not limited herein. In the above-mentioned display device according to the embodiment of the present disclosure, some capacitor structures no longer need via holes and connecting lines to connect corresponding positions of the source/drain, thereby reducing the space for manufacturing the via holes and connecting lines, and reducing the size of the whole circuit.

Figure 6:
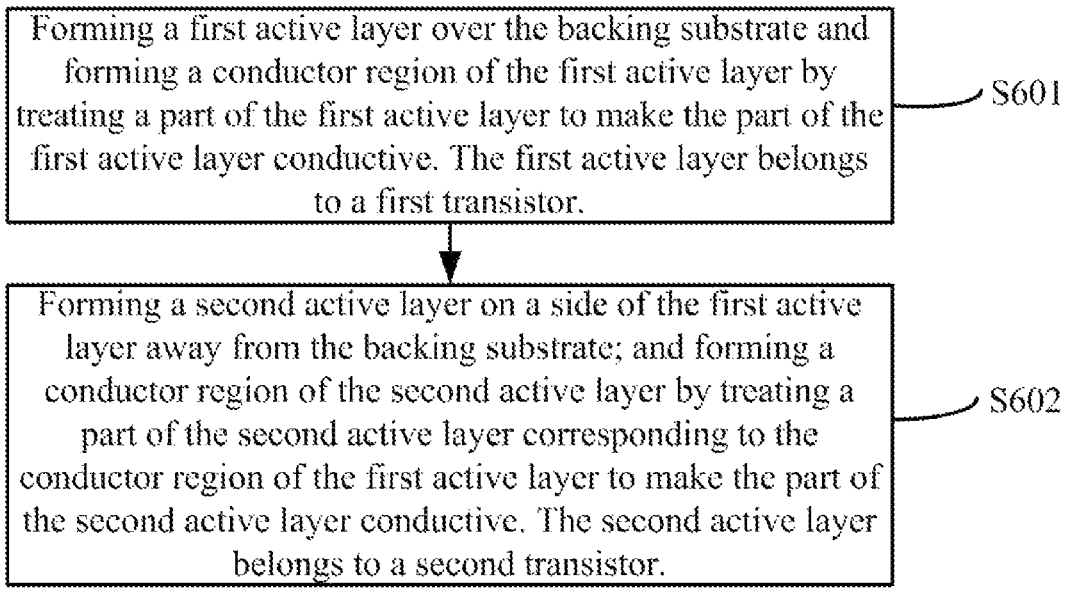
FIG. 6 is a first flow chart diagram of a manufacturing method of the display panel according to the embodiment of the present disclosure.

On the other hand, the embodiment of the present disclosure further provides a method for manufacturing a display panel. As shown in FIG. 6, the manufacturing method of the display panel according to the embodiment of the present disclosure specifically comprises the following operations.

S601, forming a first active layer over the backing substrate and forming a conductor region of the first active layer by treating a part of the first active layer to make the part of the first active layer conductive. The first active layer belongs to a first transistor.

S602, forming a second active layer on a side of the first active layer away from the backing substrate; and forming a conductor region of the second active layer by treating a part of the second active layer corresponding to the conductor region of the first active layer to make the part of the second active layer conductive. The second active layer belongs to a second transistor.

The perpendicular projection of the conductor region of the first active layer on the backing substrate and a perpendicular projection of the conductor region of the second active layer on the backing substrate have an overlapping region. A part of the conductor region of the first active layer corresponding to the overlapping region forms as a first electrode. A part of the conductor region of the second active layer corresponding to the overlapping region forms a second electrode. And the first electrode and the second electrode form two electrodes of a capacitor.

By adopting the manufacturing method of the above-mentioned display panel according to the embodiment of the present disclosure, the parts of the conductor regions of the first active layer and the second active layer corresponding to the overlapping region respectively serve as two electrodes of the capacitor, thereby simplifying the operations for manufacturing the capacitor structure connected between the source/drain of the first transistor and the source/drain of the second transistor. Furthermore, the capacitor structure no longer needs via holes and connecting lines to connect the positions of corresponding source and drain, thereby reducing the space for manufacturing the via hole and the connecting line and reducing the whole size of a circuit.

Furthermore, the materials adopted by the first active layer and the second active layer can be different, where the first active layer is made of a low-temperature polycrystalline silicon semiconductor, while the second active layer is made of an oxide semiconductor. In addition, the first active layer and the second active layer can also be manufactured by adopting other materials or a same material, and the material selection of the active layers is not specifically limited in the embodiment of the present disclosure.

The manufacturing process of the display panel is illustrated below specifically with the first active layer adopting low-temperature polycrystalline silicon and the second active layer adopting an oxide semiconductor as an example.

During a specific implementation, in the above-mentioned operation S601, forming the conductor region of the first active layer by treating the part of the first active layer to make the part of the first active layer conductive includes: heavily doping the part of the first active layer to form the conductor region of the first active layer.

Furthermore, in the above operation S602, forming the conductor region of the second active layer by treating the part of the second active layer corresponding to the conductor region of the first active layer to make the part of the second active layer conductive includes: conducting plasma processing on the part of the second active layer corresponding to the conductor region of the first active layer to form the conductor region of the second active layer.

The gas used for plasma processing is one of helium, argon, hydrogen or nitrogen.

In the embodiment of the present disclosure, the parts of the first active layer and the second active layer corresponding to the overlapping region are subjected to conductive processing, respectively, with respect to different materials, such that the parts corresponding to the overlapping region are converted into conductors to serve as two electrodes of a capacitor structure.

Figure 7:
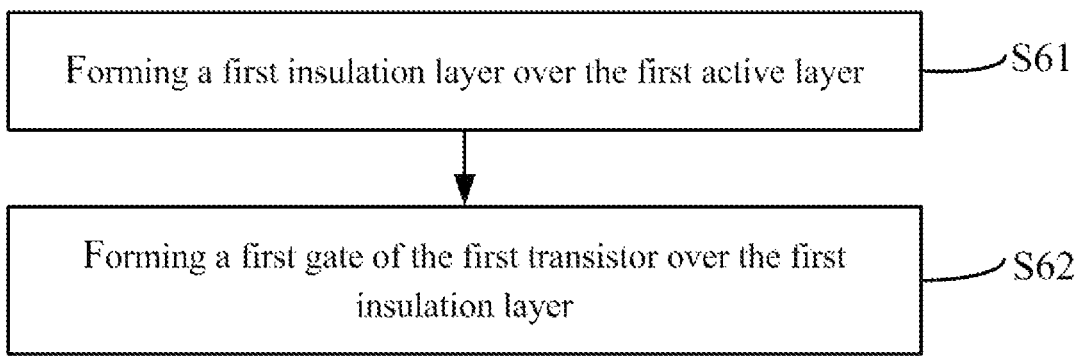
FIG. 7 is a second flow chart diagram of a manufacturing method of the display panel according to the embodiment of the present disclosure.

In the manufacturing method of the display panel according to the embodiment of the present disclosure, in the above-mentioned operation S601, before forming the conductor region of the first active layer by treating the part of the first active layer to make the part of the first active layer conductive, the manufacturing method further includes the following manufacturing operations shown in FIG. 7, which is another flow schematic diagram of the manufacturing method of the display panel according to the embodiment of the present disclosure.

S61, forming a first insulation layer over the first active layer.

S62, forming a first gate of the first transistor over the first insulation layer.

A perpendicular projection of the first gate on the first active layer is located in a first channel region of the first active layer. The first channel region does not overlap the conductor region of the first active layer.

Figure 8A:
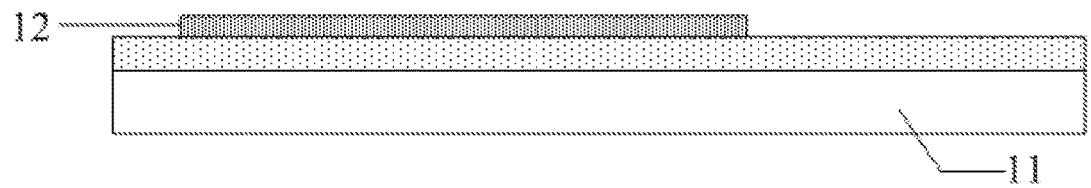
FIGS. 8A-8K show cross sections of a sequence of steps in the manufacturing process of the display panel according to the embodiment of the present disclosure.
Figure 8B:
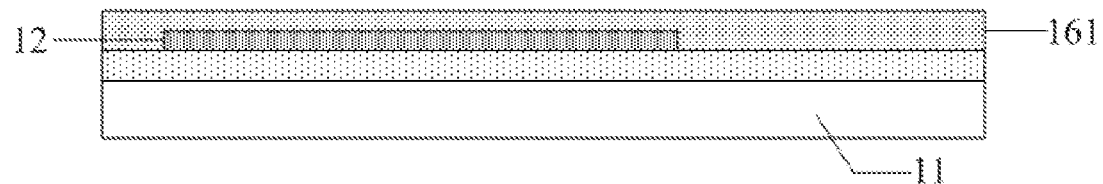
Figure 8C:
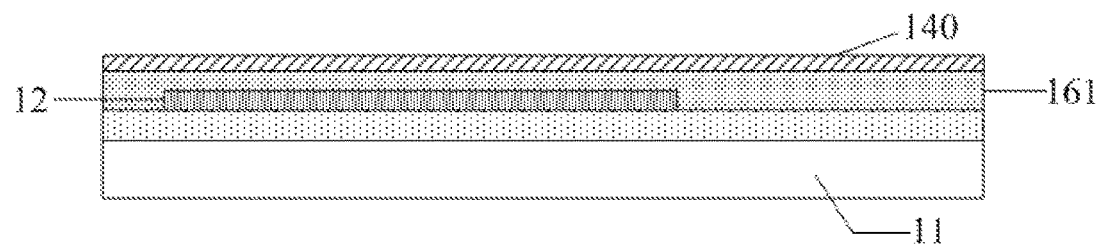
Figure 8D:
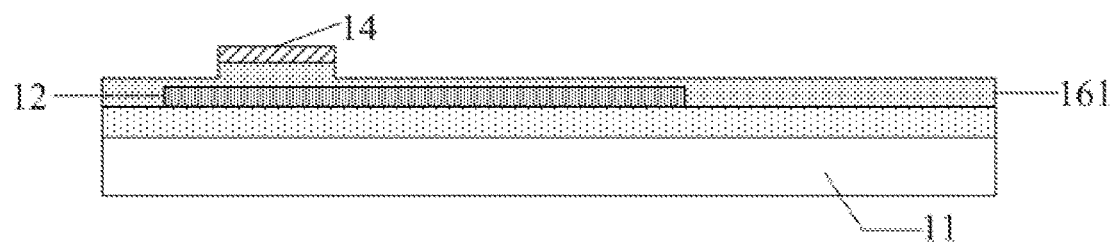
Figure 8E:
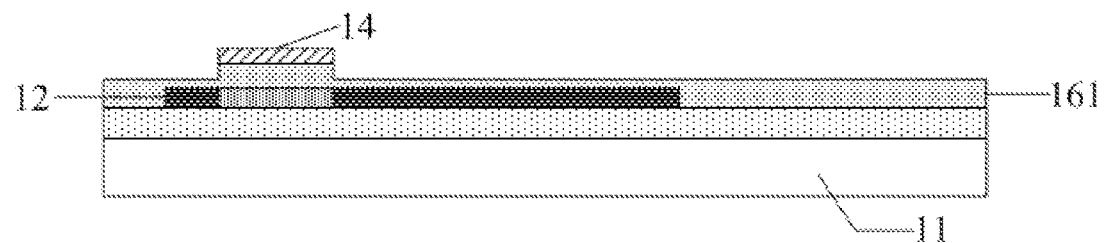

For the convenience of description, cross sections of the display panel corresponding to each manufacturing process step are shown in FIGS. 8A to 8K. In a specific manufacturing process, firstly, the first active layer 12 is formed over the backing substrate 11 (please refer to FIG. 8A). Before a part of the first active layer is treated to make the part of the first active layer conductive, a first gate of the first transistor needs to be formed. A first insulation layer 161 is covered over the first active layer 12 (please refer to FIG. 8B), and the first insulation layer is served as the gate insulation layer of the first gate. Then a metal layer 140 is formed over the first insulation layer 161 (please refer to FIG. 8C). And the metal layer 140 is then patterned to form the first gate 14 (for the structure subjected to patterning processing, please refer to FIG. 8D). On this basis, the operation of treating the part of the first active layer 12 to make the part of the first active layer 12 conductive is conducted. And the first insulation layer 161 (namely the gate insulation layer of the first gate) is composed of a silicon oxide layer and a silicon nitride layer where one layer is arranged over another, and the silicon oxide layer is closer to the first active layer. Since in the conductive processing of the first active layer, ion doping is performed in the form of ion implantation, the gate insulation layer of the first gate needs to be subjected to thinning process first, in order to ensure effective implantation of an ion beam. In an actual application, when the first gate is formed through etching, as shown in FIG. 8D, the silicon nitride layer in the insulation layer can be corroded simultaneously, so as to expose the silicon oxide layer. As the strength of ion implantation is great, the ions can penetrate through the silicon oxide layer and reaches the first active layer for heavy doping of ions, thereby completing the process of conductive processing on the part of the first active layer (the structure when the conductive processing is completed is shown in FIG. 8E, where the parts filled with a darker color in the first active layer are the parts which are subjected to conductive processing).

Since the second transistor can adopt both a top gate structure and a bottom gate structure, the manufacturing process might be different. When the second transistor adopts a bottom gate structure, in the above operation S602, before forming the second active layer on the side of the first active layer away from the backing substrate, the manufacturing method further includes the following manufacturing operation: forming the second gate of the second transistor on the side of the first active layer away from the backing substrate.

A perpendicular projection of the second gate on the second active layer is located in a second channel region of the second active layer. The second channel region does not overlap the conductor region of the second active layer.

Figure 8F:
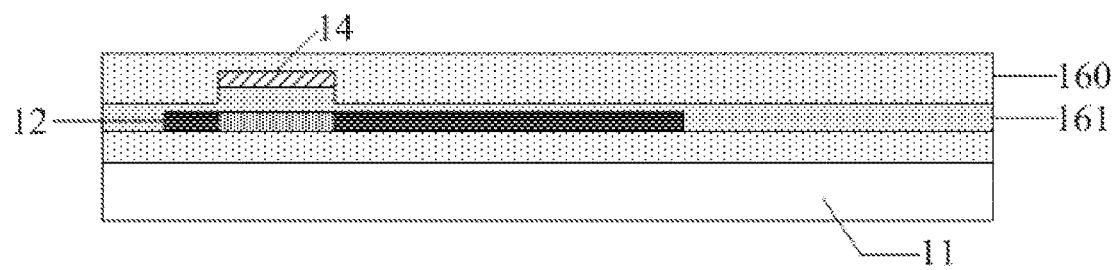
Figure 8G:
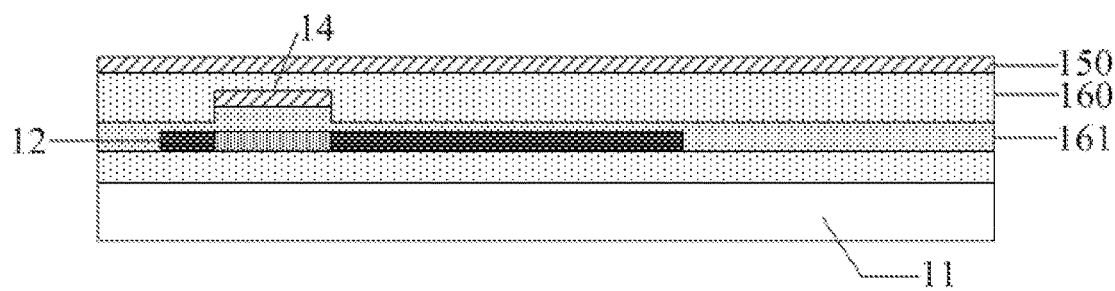
Figure 8H:
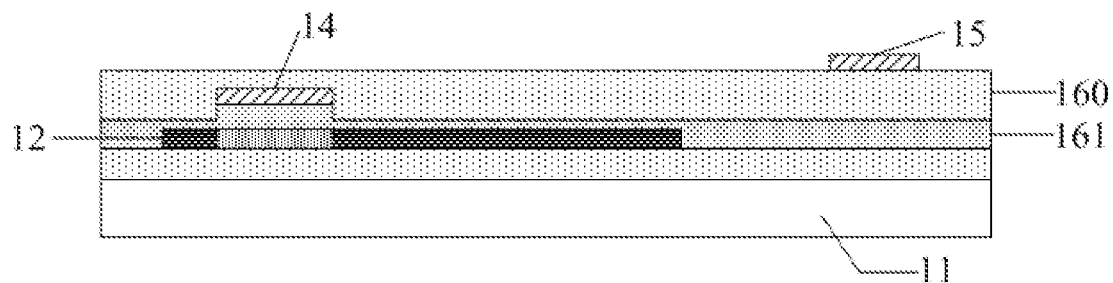
Figure 8I:
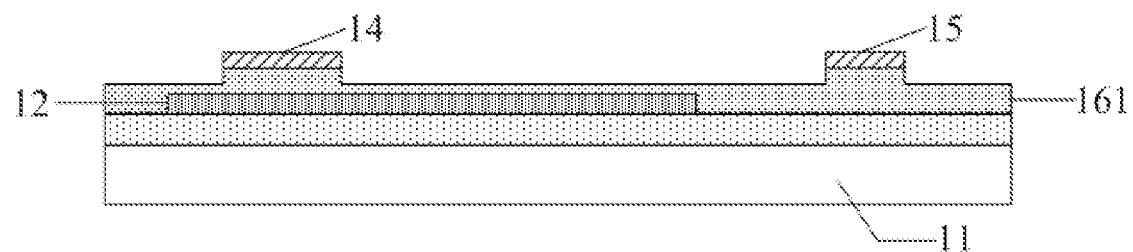
Figure 8J:
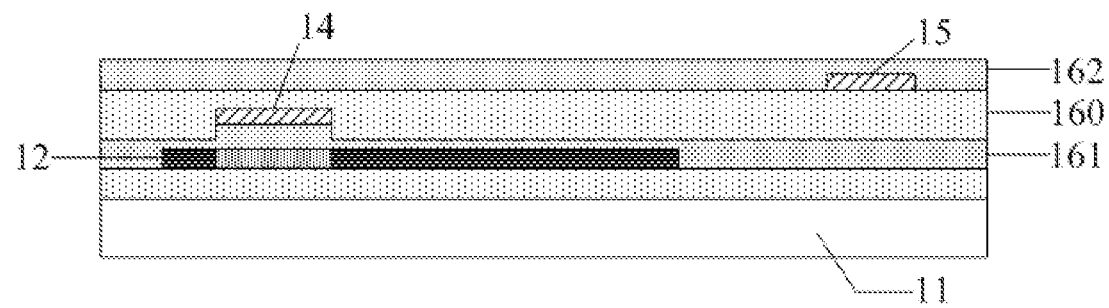
Figure 8K:
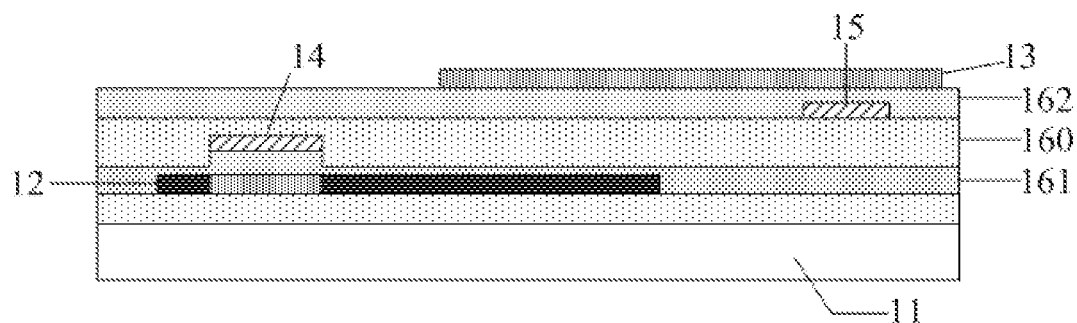

In a specific implementation, as shown in FIG. 8F, an interlayer insulation layer 160 can be formed above the first insulation layer 161 and the first gate 14 after the first active layer is treated to be conductive, and then the interlayer insulation layer 160 can be covered with a metal layer 150 of the second gate configured to form the second transistor (please refer to FIG. 8G), then the metal layer 150 is patterned to form the second gate 15 (for the patterned structure, please refer to FIG. 8H).

In another implementation, the first gate 14 and the second gate 15 can be arranged on a same layer. The first gate and the second gate can be formed by adopting one composition process, thereby omitting another process of manufacturing the second gate separately. In other words, on the basis of the structure shown in FIG. 8C, the metal layer 140 is patterned, and the first gate 14 and the second gate 15 are formed simultaneously (for the patterned structure, please refer to FIG. 8I). When the first gate and the second gate are arranged on the same layer, the perpendicular projections of the first gate and the second gate on the backing substrate do not overlap.

Furthermore, take the first gate 14 and the second gate 15 being arranged on different layers as an example. On the basis of FIG. 8H, after the second gate 15 is formed, a second insulation layer 162 is formed above the interlayer insulation layer 160 and the second gate 15 (please refer to FIG. 8J), the second insulation layer 162 is a gate insulation layer of the second gate 15, and a second active layer 13 is formed over the second insulation layer (please refer to FIG. 8K).

Figure 9:
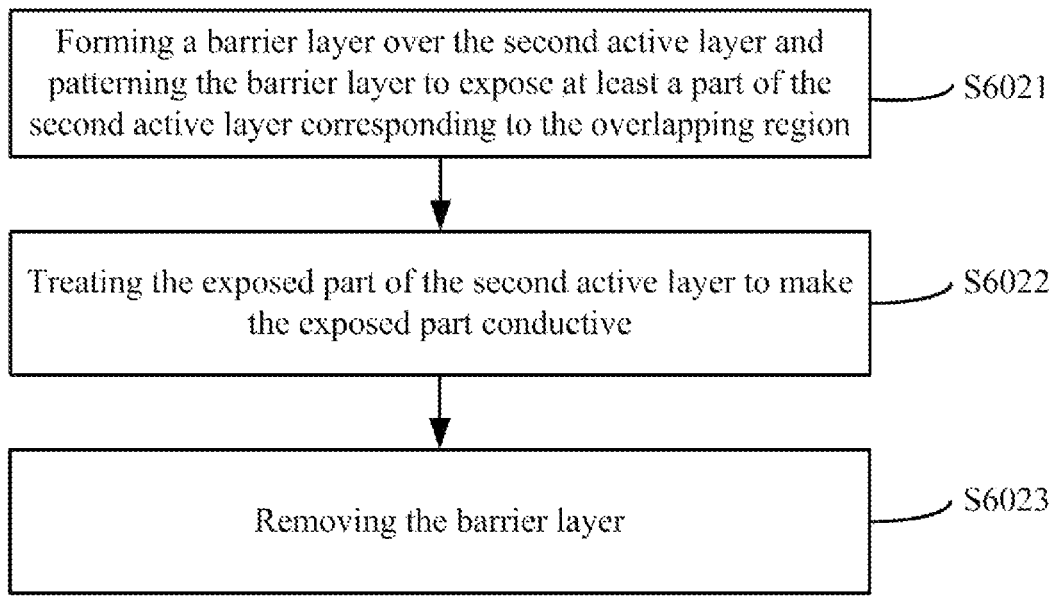
FIG. 9 is a third flow chart of a manufacturing method of the display panel according to the embodiment of the present disclosure.

Furthermore, in the above-mentioned operation S602, forming a conductor region of the second active layer by treating a part of the second active layer corresponding to the conductor region of the first active layer to make the part of the second active layer conductive includes the following manufacturing operations as shown in FIG. 9 which is another flow schematic diagram of the manufacturing method of the display panel according to the embodiment of the present disclosure.

S6021: forming a barrier layer over the second active layer and patterning the barrier layer to expose at least a part of the second active layer corresponding to the overlapping region.

S6022: treating the exposed part of the second active layer to make the exposed part conductive.

S6023: removing the barrier layer.

Figure 10A:
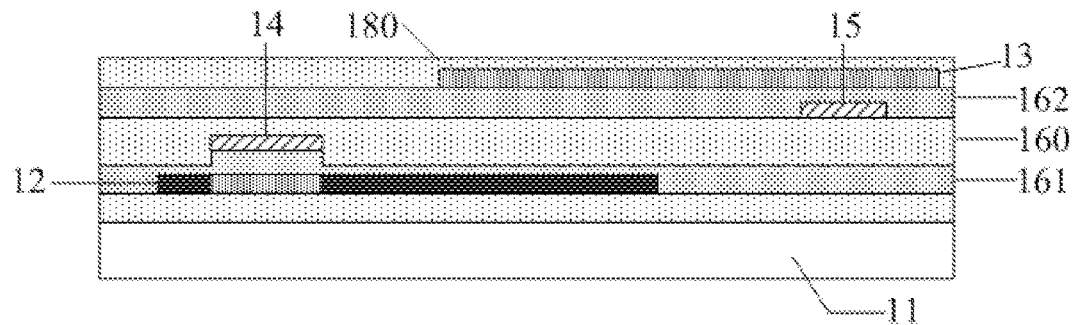
FIGS. 10A-10F show cross sections of a sequence of steps in the manufacturing process of the display panel according to the embodiment of the present disclosure.
Figure 10B:
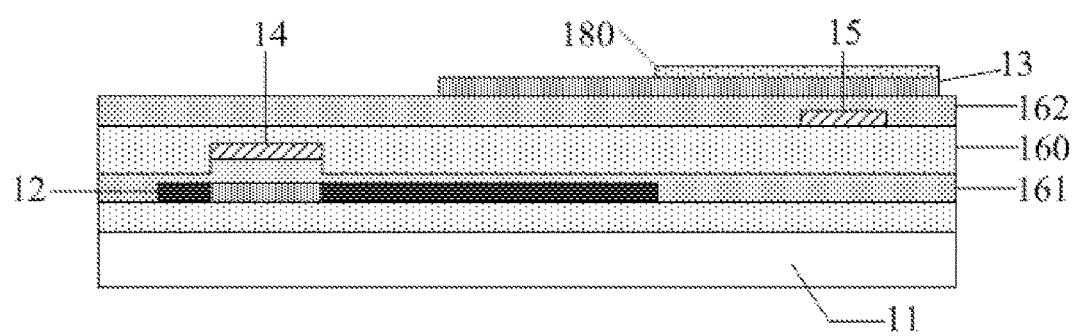
Figure 10C:
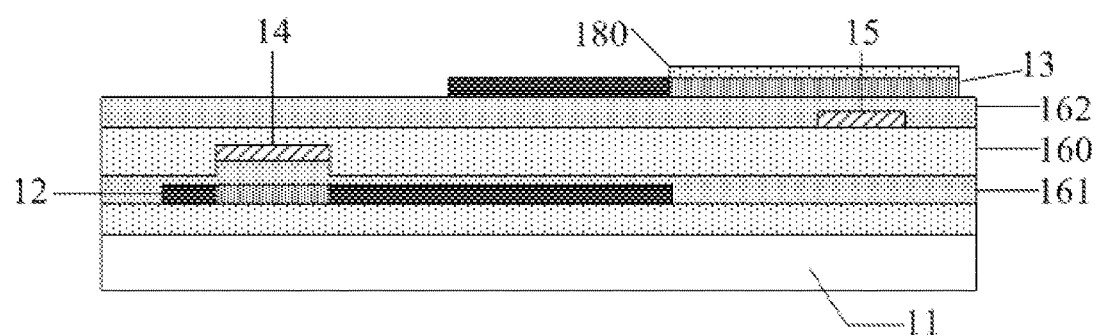
Figure 10D:
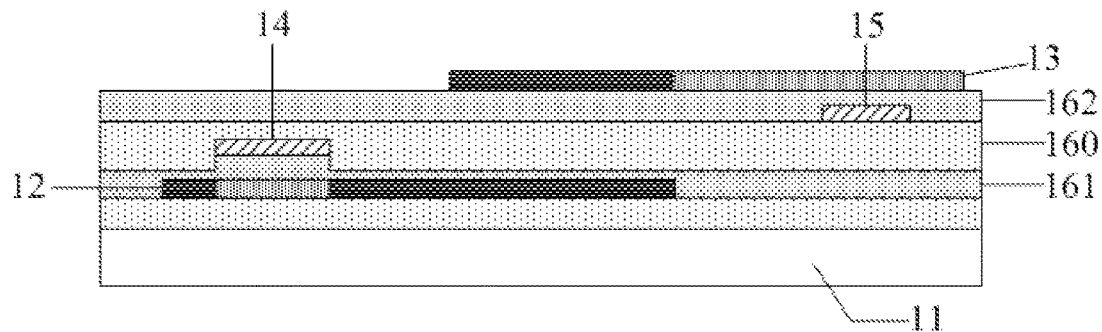
Figure 10E:
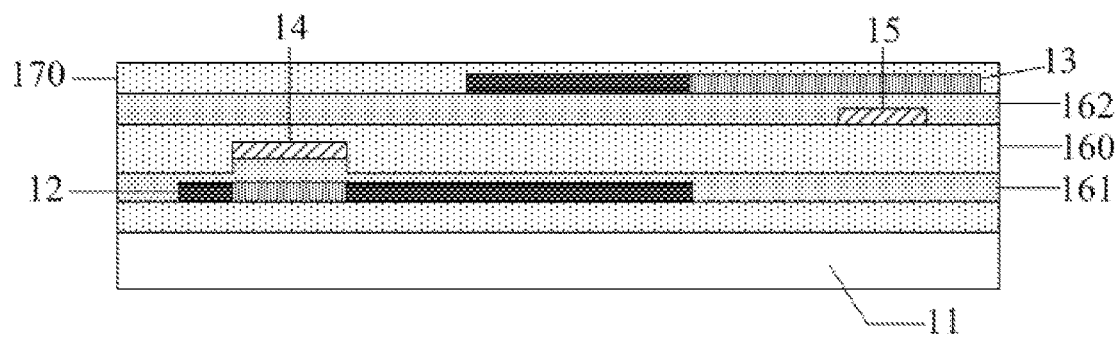

For section effects of the display panel corresponding to specific manufacturing operations, please refer to FIG. 10A to FIG. 10F. FIG. 10A is a structural schematic diagram of forming a barrier layer 180 over the second active layer 13 on the basis of FIG. 8K. The barrier layer 180 is then patterned to expose the part of the second active layer which needs to be treated to be conductive (for the patterned structure, please refer to FIG. 10B). Furthermore, the exposed part of the second active layer is treated to be conductive, and for the structure after conductive processing, please refer to FIG. 10C, wherein the regions filled with darker color are the parts of the second active layer subjected to conductive processing. After the exposed part of the second active layer is treated to be conductive, the barrier layer covering the second active layer is removed, and the structure is shown in FIG. 10D. During a specific implementation, the above-mentioned barrier layer can be a photoresist layer or a layer made of another light-sensitive material. By exposing the photoresist layer, a part of photoresist layer covering the surface of the part of the second active layer which is to be treated to be conductive could be removed, while the reserved part of photoresist layer can protect the part of the second active layer which serves as the second channel region from being influenced by the conductive processing. After the photoresist layer is patterned, the exposed part of the second active layer is treated to be conductive, for example, gas plasma can be adopted to process the exposed part of the second active layer, such that such part of the second active layer is conductive. After finishing the conductive processing, the remaining part of the photoresist layer can all be removed.

Figure 10F:
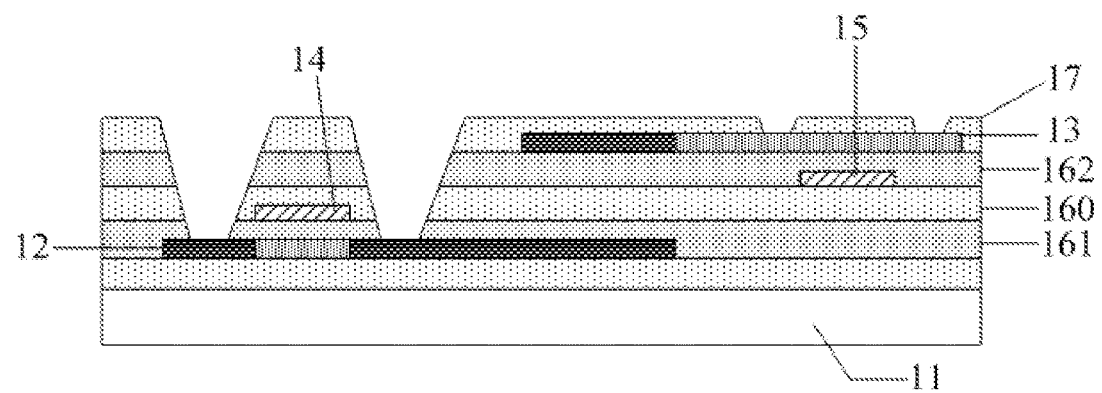

Thereafter, a material layer 170 with an anti-etching property is formed above the second active layer (please refer to FIG. 10E), and the material layer 170 and other insulation layers are etched to form the etching barrier layer 17, and to form via holes configured for exposing the source/drain contact regions of the active layers of the first transistor and the second transistor (for the etched structure, please refer to FIG. 10F). Furthermore, the sources and drains of the first transistor and the second transistor are respectively formed in each via hole region, thereby finishing all the manufacturing of the first transistor as a top gate structure and the second transistor as a bottom gate structure. The structure after the manufacturing is finished is shown in FIG. 3, where the constituted capacitor C is within the dotted rectangle, and the two electrodes of the capacitor are P1 and P2, respectively.

Figure 11:
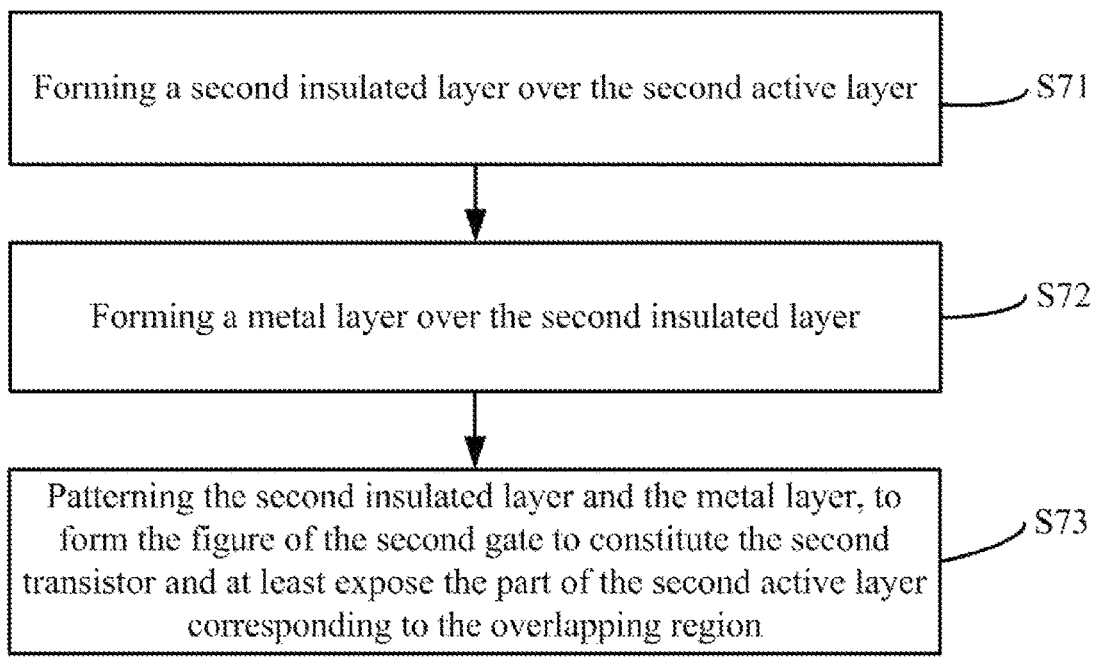
FIG. 11 is a fourth flow chart of a manufacturing method of the display panel according to the embodiment of the present disclosure.

In another implementation, when the second transistor adopts a top gate structure, in the above operation S602, before forming the conductor region of the second active layer by treating the part of the second active layer corresponding to the conductor region of the first active layer to make the part of the second active layer conductive, the following manufacturing operations are further included as shown in FIG. 11, which is another flow schematic diagram of the manufacturing method of the display panel according to the embodiment of the present disclosure.

S71: forming a second insulation layer over the second active layer.

S72: forming a metal layer over the second insulation layer.

S73: patterning the second insulation layer and the metal layer, to form the second gate of the second transistor and at least expose the part of the second active layer corresponding to the overlapping region.

Figure 12A:
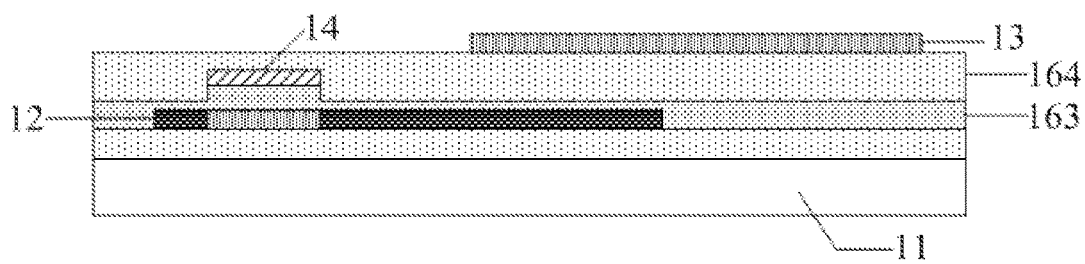
FIGS. 12A-12G show cross sections of a sequence of steps in the manufacturing process of the display panel according to the embodiment of the present disclosure.
Figure 12B:
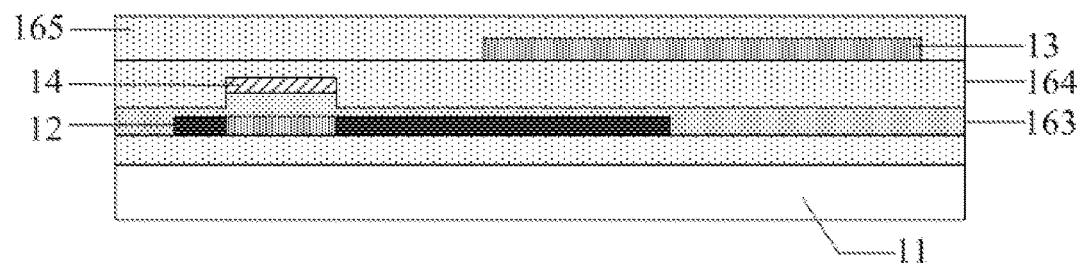
Figure 12C:
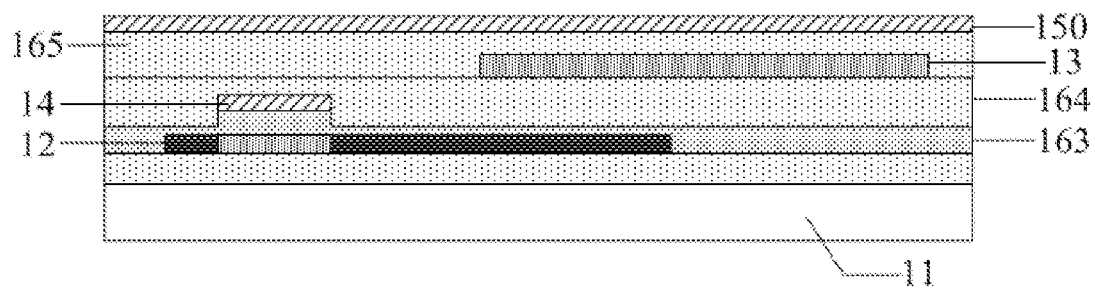
Figure 12D:
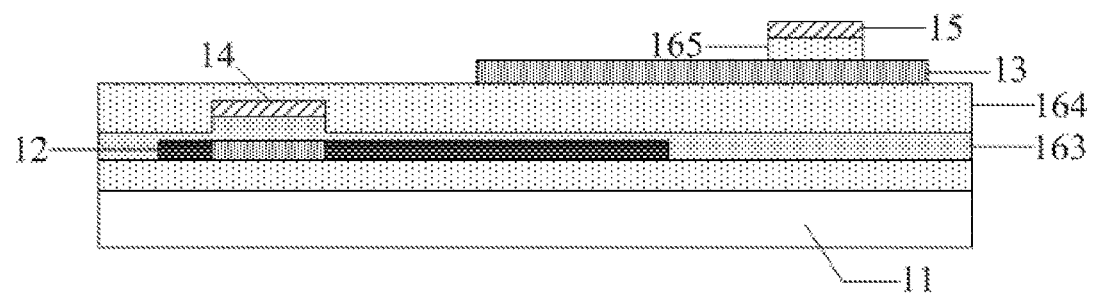
Figure 12E:
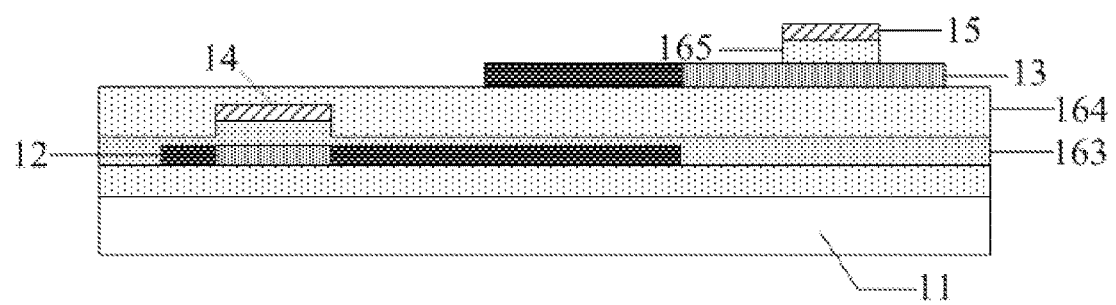
Figure 12F:
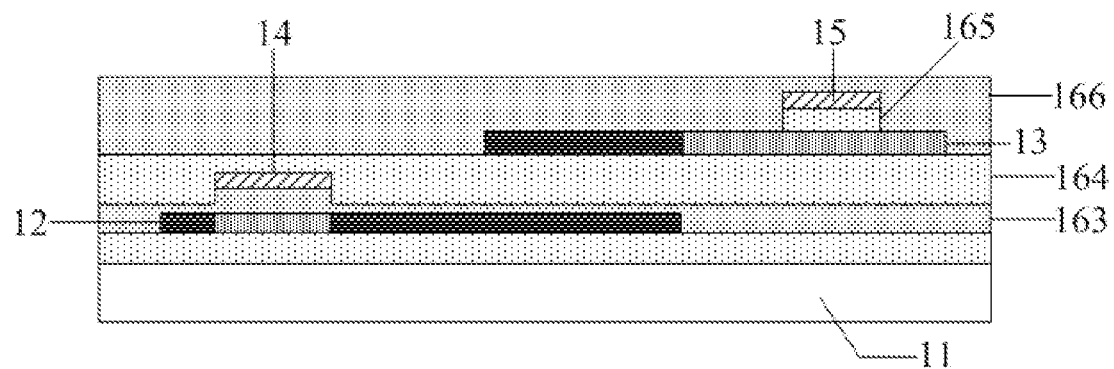
Figure 12G:
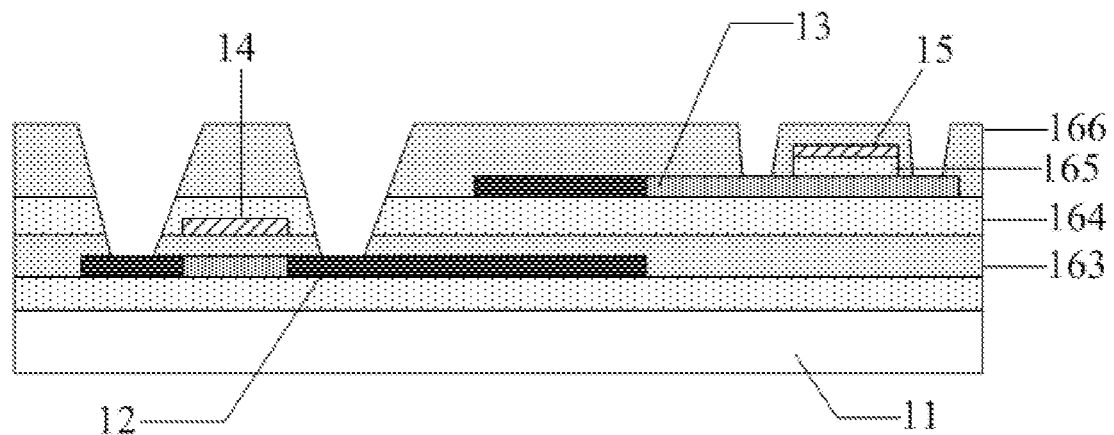

During specific implementation, the manufacturing process of the second transistor of the top gate structure slightly differs from the manufacturing process of the second transistor of the bottom gate structure, while the manufacturing process of the first transistor remains unchanged. Specifically, the manufacturing operations of the first active layer is consistent, namely, the manufacturing processes of FIG. 8A to FIG. 8B are consistent. In order to distinguish the manufacturing processes of the two display panels, some reference numerals in the figure are renamed. On the basis of the structure shown in FIG. 8F, section effects of the display panel corresponding to the follow-up manufacturing operations are shown in FIG. 12A to FIG. 12G. As shown in FIG. 12A, 163 represents the gate insulation layer of the first gate 12 and a second active layer 13 is formed over the interlayer insulation layer 164. Then a second insulation layer 165 configured to form the second gate (please refer to FIG. 12B) and a metal layer 150 configured to form the second gate (please refer to FIG. 12C) are formed over the second active layer 13. As shown in FIG. 4, when the second transistor is of a top gate structure, the second gate and the gate insulation layer of the second gate are consistent, therefore, the second insulation layer and the metal layer can be patterned simultaneously (for the patterned structure, please refer to FIG. 12D), so as to form the second gate and expose the part of the second active layer which needs to be subjected to conductive processing. And then the second active layer is subjected to conductive processing (for the structure after the conductive processing, please refer to FIG. 12E, and the parts filled with darker color of the second active layer are the part which are subjected to conductive processing), specific conductive processing manners are the same as the above-mentioned manner of performing conductive processing on the second active layer and thus is not repeated redundantly herein. After the second active layer is subjected to conductive processing, a layer of insulation layer 166 can be further formed over the second active layer and the second gate (please refer to FIG. 12F), and then the insulation layer 166 and each insulation layer located below are etched, so as to form the via holes configured for exposing the source/drain contact regions of the active layers of the first transistor and the second transistor (for the etched structure, please refer to FIG. 12G). Furthermore, the source/drain of the first transistor and the second transistor are respectively formed in each via hole region, thereby finishing all the manufacturing of the first transistor as a top gate structure and the second transistor as a bottom gate structure, and the structure after the manufacturing is finished is as shown in FIG. 4, wherein the constituted capacitor C is within the dotted rectangle, and the two electrodes of the capacitor are P1 and P2, respectively.

The embodiment of the present disclosure provides a display panel, a manufacturing method thereof and a display device. The display panel includes a backing substrate, a first active layer arranged over the backing substrate; and a second active layer. The first active layer belongs to a first transistor. The second active layer belongs to a second transistor. The second active layer is arranged on a side of the first active layer away from the backing substrate. The first active layer and the second active layer each include a conductor region, and a perpendicular projection of the conductor region of the first active layer on the backing substrate and a perpendicular projection of the conductor region of the second active layer on the backing substrate have an overlapping region. A part of the conductor region of the first active layer corresponding to the overlapping region forms as a first electrode, a part of the conductor region of the second active layer corresponding to the overlapping region forms a second electrode, and the first electrode and the second electrode form two electrodes of a capacitor. With the parts of the conductor regions of both the first active layer and the second active layer corresponding to the overlapping regions respectively serving as the two electrodes of the capacitor, manufacturing process of the capacitor structure connecting a source/drain of a first transistor and a source/drain of a second transistor can be simplified, as the capacitor structure no longer needs via holes and connecting lines to connect positions of corresponding sources/drains, thereby reducing space taken up by via holes and connecting lines, and reducing the size of the whole circuit.

Although an optional embodiment of the present disclosure has been described, once those skilled in the art know the basic creative concepts, they can make additional modifications and variations to the embodiment. Therefore, the appended claims are intended to be explained as including the embodiment and all the modifications and variations falling into the scope of the present disclosure.

Evidently, those skilled in the art can make various modifications and variations to the present disclosure without departing from the spirit and scope of the present disclosure. Accordingly, the present disclosure is also intended to encompass these modifications and variations thereto so long as the modifications and variations come into the scope of the claims appended to the disclosure and their equivalents.

What is claimed is:

1. A display panel, comprising:
a backing substrate;
a first active layer arranged over the backing substrate; wherein the first active layer belongs to a first transistor; and
a second active layer; wherein the second active layer belongs to a second transistor;

wherein the second active layer is arranged on a side of the first active layer away from the backing substrate;

wherein the first active layer and the second active layer each comprise a conductor region, and a perpendicular projection of the conductor region of the first active layer on the backing substrate and a perpendicular projection of the conductor region of the second active layer on the backing substrate have an overlapping region; and wherein a part of the conductor region of the first active layer corresponding to the overlapping region forms as a first electrode, a part of the conductor region of the second active layer corresponding to the overlapping region forms a second electrode, and the first electrode and the second electrode form two electrodes of a capacitor.

2. The display panel according to claim 1, wherein the first active layer and the second active layer are made of different materials.

3. The display panel according to claim 1, wherein parts of both the first and the second active layers corresponding to the overlapping region are layers treated to be conductive.

4. The display panel according to claim 3, wherein the first active layer is made of a low-temperature polycrystalline silicon semiconductor; and the part of the first active layer corresponding to the overlapping region is heavily-doped.

5. The display panel according to claim 3, wherein the second active layer is made of an oxide semiconductor; and the part of the second active layer corresponding to the overlapping region is treated with a plasma processing method.

6. The display panel according to claim 1, wherein the first transistor comprises a first gate and the second transistor comprises a second gate;

wherein a perpendicular projection of the first gate on the first active layer is located in a first channel region and a perpendicular projection of the second gate on the second active layer is located in a second channel region; and wherein the first channel region does not overlap the conductor region of the first active layer; and the second channel region does not overlap the conductor region of the second active layer.

7. The display panel according to claim 6, wherein the first gate and the second gate are located between the first active layer and the second active layer; and the display panel further comprises: a first insulation layer arranged between the first active layer and the first gate, and a second insulation layer arranged between the second active layer and the second gate.

8. The display panel according to claim 7, wherein the first gate and the second gate are arranged on a same layer, and a perpendicular projection of the first gate on the backing substrate and a perpendicular projection of the second gate on the backing substrate do not overlap.

9. The display panel according to claim 7, further comprising an etching barrier layer located on a side of the second active layer away from the backing substrate;

wherein the first active layer further comprises a first source contact region and a first drain contact region separated by the first channel region;

wherein the second active layer further comprises a second source contact region and a second drain contact region separated by the second channel region.

10. The display panel according to claim 6, wherein the first gate is located between the first active layer and the second active layer, and the second gate is located on a side of the second active layer away from the backing substrate;

wherein the display panel further comprises: a third insulation layer arranged between the first active layer and the first gate, a fourth insulation layer arranged between the second active layer and the first gate, a fifth insulation layer arranged between the second gate and the second insulation layer, and a sixth insulation layer arranged on a side of the second gate away from the second active layer.

11. A display device, comprising a display panel, the display panel comprising:

a backing substrate;

a first active layer arranged over the backing substrate; wherein the first active layer belongs to a first transistor; and a second active layer; wherein the second active layer belongs to a second transistor;

wherein the second active layer is arranged on a side of the first active layer away from the backing substrate;

wherein the first active layer and the second active layer each comprise a conductor region, and a perpendicular projection of the conductor region of the first active layer on the backing substrate and a perpendicular projection of the conductor region of the second active layer on the backing substrate have an overlapping region; and wherein a part of the conductor region of the first active layer corresponding to the overlapping region forms as a first electrode, a part of the conductor region of the second active layer corresponding to the overlapping region forms a second electrode, and the first electrode and the second electrode form two electrodes of a capacitor.

12. A method for manufacturing the display panel according to claim 1, the method comprising:

forming the first active layer over the backing substrate, wherein the first active layer belongs to the first transistor;

forming the conductor region of the first active layer by treating the part of the first active layer to make the part of the first active layer conductive;

forming the second active layer on the side of the first active layer away from the backing substrate; wherein the second active layer belongs to the second transistor; and forming the conductor region of the second active layer by treating the part of the second active layer corresponding to the conductor region of the first active layer to make the part of the second active layer conductive;

wherein the perpendicular projection of the conductor region of the first active layer on the backing substrate and the perpendicular projection of the conductor region of the second active layer on the backing substrate have the overlapping region; and wherein the part of the conductor region of the first active layer corresponding to the overlapping region forms as the first electrode, the part of the conductor region of the second active layer corresponding to the overlapping region forms the second electrode, and the first electrode and the second electrode form the two electrodes of the capacitor.

13. The manufacturing method according to claim 12, wherein the first active layer is made of a low-temperature polycrystalline silicon semiconductor, and forming the conductor region of the first active layer by treating the part of the first active layer to make the part of the first active layer conductive comprises:

heavily doping the part of the first active layer to form the conductor region of the first active layer.

14. The manufacturing method according to claim 12, wherein the second active layer is made of an oxide semiconductor, and forming the conductor region of the second active layer by treating the part of the second active layer corresponding to the conductor region of the first active layer to make the part of the second active layer conductive comprises:

conducting plasma processing on the part of the second active layer corresponding to the conductor region of the first active layer to form the conductor region of the second active layer.

15. The manufacturing method according to claim 14, wherein the gas used for plasma processing is one of helium, argon, hydrogen or nitrogen.

16. The manufacturing method according to claim 12, wherein the method further comprises: prior to forming the conductor region of the first active layer by treating the part of the first active layer to make the part of the first active layer conductive:

forming a first insulation layer over the first active layer; and forming a first gate of the first transistor over the first insulation layer, wherein a perpendicular projection of the first gate on the first active layer is located in a first channel region of the first active layer; and wherein the first channel region does not overlap the conductor region of the first active layer.

17. The manufacturing method according to claim 12, further comprising:

prior to forming the second active layer on the side of the first active layer away from the backing substrate:

forming a second gate of the second transistor on the side of the first active layer away from the backing substrate, wherein a perpendicular projection of the second gate on the second active layer is located in a second channel region of the second active layer; and wherein the second channel region does not overlap the conductor region of the second active layer.

18. The manufacturing method according to claim 17, wherein forming the conductor region of the second active layer by treating the part of the second active layer corresponding to the conductor region of the first active layer to make the part of the second active layer conductive comprises:

forming a barrier layer over the second active layer and patterning the barrier layer to expose at least a part of the second active layer corresponding to the overlapping region;

treating the exposed part of the second active layer to make the exposed part conductive; and removing the barrier layer.

19. The manufacturing method according to claim 17, wherein a first gate and a second gate are formed on a same layer, and a perpendicular projection of the first gate and a perpendicular projection of the second gate on the backing substrate do not overlap.

20. The manufacturing method according to claim 12, further comprising:

prior to forming the conductor region of the second active layer by treating the part of the second active layer corresponding to the conductor region of the first active layer to make the part of the second active layer conductive:

forming a second insulation layer over the second active layer;

forming a metal layer over the second insulation layer; and patterning the second insulation layer and the metal layer to form a second gate of the second transistor and expose at least the part of the second active layer corresponding to the overlapping region.

\* \* \* \* \*